United States Patent [19]

Sakai

[11] Patent Number: 4,939,360
[45] Date of Patent: Jul. 3, 1990

[54] PARTICLE BEAM IRRADIATING APPARATUS HAVING CHARGE SUPPRESSING DEVICE WHICH APPLIES A BIAS VOLTAGE BETWEEN A CHANGE SUPPRESSING PARTICLE BEAM SOURCE AND THE SPECIMEN

[75] Inventor: Katsuhiko Sakai, Katsuta, Japan

[73] Assignee: Hitachi, Ltd., Tokyo, Japan

[21] Appl. No.: 310,917

[22] Filed: Feb. 16, 1989

[30] Foreign Application Priority Data

Feb. 26, 1988 [JP] Japan ................... 63-41930

[51] Int. Cl.⁵ .............................. H01J 37/00
[52] U.S. Cl. ..................... 250/251; 250/398
[58] Field of Search ............... 250/306, 307, 309, 310, 250/398, 492.2, 492.21, 251

[56] References Cited

U.S. PATENT DOCUMENTS

| | | | |
|---|---|---|---|
| 3,507,709 | 4/1970 | Bower | 250/492.2 |
| 3,665,185 | 5/1972 | Goff | 250/309 |
| 4,118,630 | 10/1978 | McKenna et al. | 250/398 |
| 4,135,097 | 1/1979 | Forneris et al. | 250/306 |
| 4,361,762 | 11/1982 | Douglas | 250/492.21 |
| 4,419,203 | 12/1983 | Harper et al. | 250/492.3 |
| 4,453,086 | 6/1984 | Grobman | 250/307 |
| 4,463,255 | 7/1984 | Robertson et al. | 250/492.2 |
| 4,639,301 | 1/1987 | Doherty et al. | 250/396 ML |
| 4,675,530 | 6/1987 | Rose et al. | 250/492.2 |
| 4,748,325 | 5/1988 | Sladzian | 250/282 |
| 4,825,087 | 4/1989 | Renau et al. | 250/423 R |

FOREIGN PATENT DOCUMENTS 452857 1/1970 Japan .
51-27981 8/1976 Japan .

*Primary Examiner*—Bruce C. Anderson
*Attorney, Agent, or Firm*—Antonelli, Terry, Stout & Kraus

[57] ABSTRACT

A particle beam irradiating apparatus including a particle beam irradiating device for irradiating a charged particle beam such as ions or electrons to a specimen. A charged particle source is included for irradiating an electron beam to the specimen which is positively charged or an ion beam to the specimen which is negatively charged so as to neutralize the specimen, and a voltage supply is include for applying a bias voltage difference not more than 10 V between the charged particle source and the specimen. As the specimen is not charged with a high voltage, the specimen does not break down.

The particle beam irradiating apparatus is effectively used in an electron microscope, an electron beam lithography system, an ion implanter, an ion microprobe analyzer, a secondary ion mass spectrometer.

8 Claims, 2 Drawing Sheets

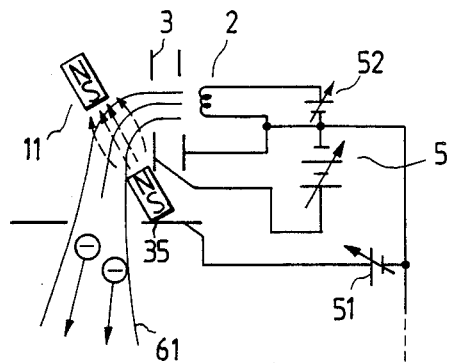
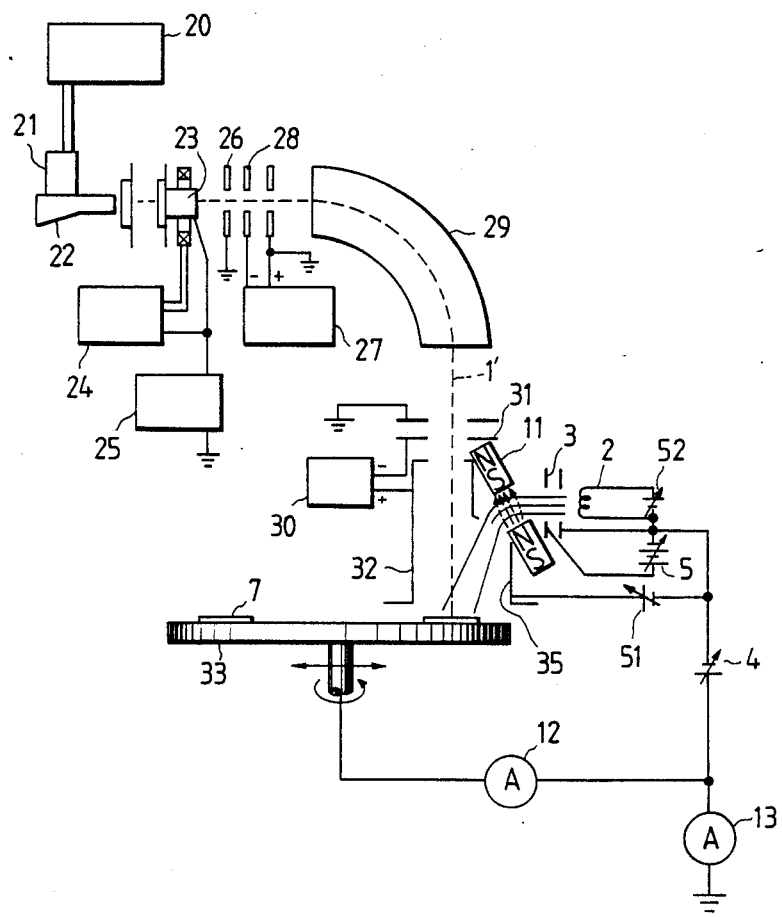

PARTICLE BEAM IRRADIATING APPARATUS HAVING CHARGE SUPPRESSING DEVICE WHICH APPLIES A BIAS VOLTAGE BETWEEN A CHANGE SUPPRESSING PARTICLE BEAM SOURCE AND THE SPECIMEN

BACKGROUND OF THE INVENTION

The present invention relates to a particle beam irradiating apparatus having a charge suppressing device for irradiating a particle beam to a specimen and more particularly to an apparatus for irradiating a particle beam which is especially suitable for neutralizing an insulated specimen or a workpiece which is not connected to earth potential in a vacuum.

When a particle beam irradiating device irradiates a particle beam such as an ion beam or an electron beam with a high velocity to a specimen which is made from an insulator or a workpiece which is not connected to the earth potential in order to analyze or process the specimen, generally almost all of the specimen is positively charged.

For example, in the case of a secondary ion mass spectrometer, ion microprobe analyzer, ion implanter etc., the specimen is irradiated with a positively charged ion beam, emits secondary electrons from the surface of the specimen, and is positively charged.

In the case of the electron microscope or the electron beam lithography system, the specimen is positively charged when more secondary electrons than irradiated electrons are emitted from the surface of the specimen.

The above-mentioned positive charge of the specimen causes some bad effects with the specimen such as a breaking down of the specimen or obstacles in the correct irradiation of the particle beam to the specimen.

Methods of preventing the positive charge of the specimen and neutralization thereof are generally known. U.S. Pat. Nos. 4,118,630, 4,135,097 and 4,463,255 are cited as examples of such systems.

However, in the conventional methods stated above, it is very difficult to determine the electrons current supplied from a charged suppressing device. The positively charged specimen is not neutralized when the electron from the suppressing device are few in number, and the specimen is apt to be negatively charged when the electrons are excessively supplied.

U.S. Pat. No. 4,675,530 shows how to control the electron current supplied from the charge suppressing device by detecting the charge build up on the surface of the specimen. But it is difficult to detect the charge on the surface accurately and to control the electrons from the charge suppressing device so as not to charge positively or negatively, while considering stray capacitance of the chamber which stores the specimen.

SUMMARY OF THE INVENTION

The present invention has been accomplished in order to overcome the above-mentioned problem of the conventional techniques.

An object of the present invention is to suppress positive or negative charges of the specimen even if the charge suppressing device supplies an excess of charged particles in order to neutralize the specimen.

The other object of this invention is to make it easy to set an amount of charged particles from the electrons or the ions supplied from the charge suppressing device.

In order to achieve the objects stated above, the particle beam irradiating apparatus in the present invention is constructed so as to supply a charged particle beam to the specimen which has almost the same electric potential with that of the charge suppressing device in order to suppress the charge of the specimen.

As the electric potential of the charge suppressing device is equal to that of the specimen, the charged particles emitted from the charge suppressing device to the specimen are decelerating in front of the specimen and almost lose moving velocity thereof. Very few charged particles reach the specimen and most of the charged particles drift near the surface of the specimen. For example, when the number of the electrons increase by a few, the specimen would be negatively charged. By repelling the electrons from the negatively charged specimen the negative charge can be suppressed. Then, the net charge of the specimen is so small there is no problem operating the particle beam irradiating apparatus.

The particle beam irradiating apparatus then starts to irradiate a positively charged particle beam on the specimen, for example. The specimen is immediately charged positively, and attracts the negatively charged particle from the charge suppressing device in order to be neutralized. When the specimen is neutralized, the voltage of the specimen comes to the same voltage as the charge suppressing device.

In the above case, the specimen is irradiated with the charged particle beam from the particle beam irradiating device to be charged positively and is neutralized by being irradiated with a negatively charged particle from the charge suppressing device. But, when the specimen is irradiated with the charged particle beam from the particle beam irradiating device so as to be charged negatively as in the case of the electron microscope etc., the specimen is neutralized by irradiating with positively charged particles such as an ion.

BRIEF DESCRIPTION OF THE DRAWINGS

FIG. 3 is a partial diagrammatic view of another embodiment showing an apparatus for irradiating a charged particle beam having a charge suppressing device and it's beam is deflected by magnetic field.

FIG. 4 is a diagrammatic view of another embodiment showing an apparatus for irradiating an ion beam having a charge suppressing device and it's beam is deflected by magnetic field.

DETAILED DESCRIPTION OF THE PREFERRED EMBODIMENTS

Figure 1:
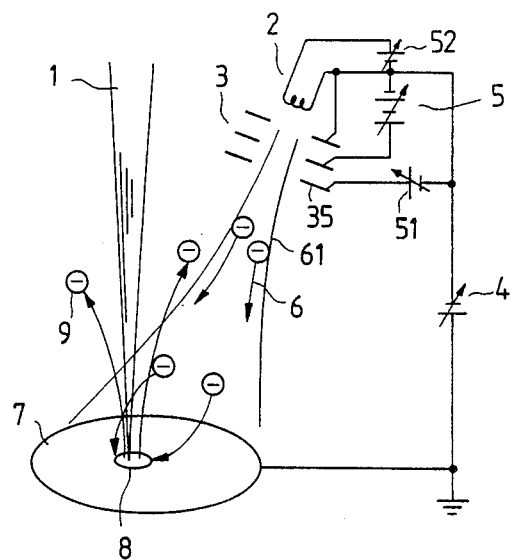
FIG. 1 is a diagrammatic view of an embodiment showing an apparatus for irradiating a charged particle beam having a charge suppressing device.

FIG. 1 is a diagrammatic view of an embodiment showing an apparatus for irradiating a charged particle beam having a charge suppressing device such as is used in ion microprobe analyzer, secondary ion mass spectrometry, ion implanter etc. In FIG. 1, 1 is a main charged particle beam such as an ion beam which is irradiated with a high velocity to the surface 8 of a specimen 7. The charge suppressing device for irradiating electrons 6 and forming an electron beam 61 consists of a filament 2, a power supply 52 for the filament 2, an extracting electrode 3 for extracting electrons 6 applied with a positive high voltage from a voltage supply 5 and a decelerating electrode 35 applied with almost an earth potential because an output voltage of the voltage supply 51 is equal to that of the voltage supply 4 and the voltage 51 is reversely connected to the voltage supply 4. The specimen 7 is irradiated with a charged particle beam 1, and at the same time, the electrons 6 from the filament 2 are irradiated to the specimen 7.

As the surface 8 of an specimen 7 is made of the insulator or a resistor substance having a high resistance and is not connected to earth potential, the voltage of the surface 8 goes up a large amount and the surface 8 is fairly charged up when the surface 8 is irradiated the charged particle beam 1.

When the surface 8 is not charged, the electron 6 from the filament 2 does not reach the surface 8 because the voltage applied to the filament 8 is almost the same as that applied to the surface 8.

When the surface 8 is irradiated by the charged particle beam 1 and positively charged, the electrons 6 from the filament 2 are attracted to the surface 8. The surface 8 attracts the electrons 6 until the positive charge on the surface is completely neutralized by the electrons 6.

When the charge on the surface 8 become zero, the electrons 6 from the filament 2 do not reach the surface 8, and the specimen is not charged negatively by the electron 6 from the filament 2.

Actually, when the voltage of the filament 2 is just equal to that of the specimen 7, the electrons 6 which are close to the specimen 7 become very few. Therefore, the voltage supply 4 gives a small negative potential difference to the filament 2 so as to supply enough electrons 6 close to the specimen 7. The potential difference applied by the voltage supply is at most 10 V, and is smaller than 10 V so as to bring enough electrons 6 close to the specimen 7 and holding them so as not to reach the specimen 7.

When the specimen 7 is negatively charged as in the electron microscope, an ion source for irradiating positive ions as $H_2$ ions etc is available instead of the charge suppressing device for irradiating electrons 6 in order to neutralize the negatively charged specimen 7.

Figure 2:
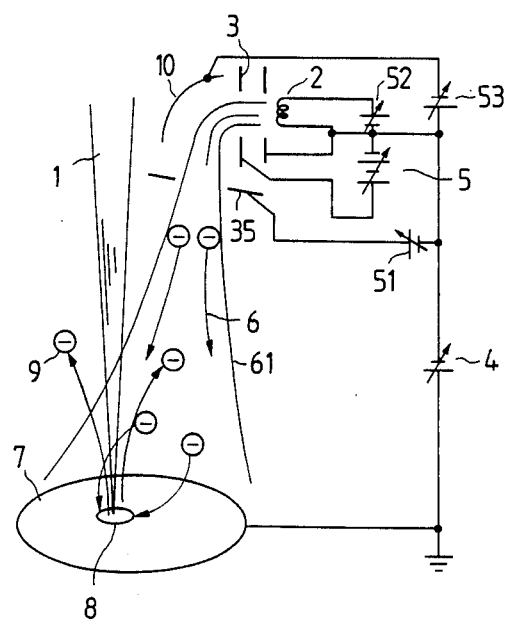
FIG. 2 is a diagrammatic view of another embodiment showing an apparatus for irradiating a charged particle beam having a charge suppressing device, the beam being deflected by electric field.

Further, in the case of the ion implanter, it is not desirable for the specimen 7 made from a semiconductor to be contaminated by the materials, for example, tungsten scattered from the filament 2 and to be heated by the filament 2. Another embodiment of the present invention shown in FIGS. 2 and 3 is accomplished to overcome the above-mentioned problem. In FIG. 2, an electric field of a deflection electrode 10 makes the electrons from the filament 2 reach the specimen by traveling along a path which is not straight. In FIGS. 1 to 3, elements designated with the same numbers operate in the same manner.

FIG. 4 is an embodiment of the present invention which shows an ion implanter using a charge suppressing device as shown in FIG. 3. A microwave in FIG. 4 generated from a magnetron 21 actuated by a magnetron power supply 20 passes through a wave-guide 22 and is guided to a coil 23 of an ion source. A current from an excitation power supply 24 flows so as to generate a magnetic field, and plasma is generated by an interaction between the magnetic field and the microwave. 25 is an accelerating power supply for applying a high voltage to the ion source. 26 is an extracting electrode for extracting an ion beam from the plasma, and the ion beam passes through a decelerating electrode 28 connected to a decelerating power supply 27 and separated according to the mass of the ion by a magnet 29 for mass spectrometry. Only a selected ion 1' separated by the magnet 29 is implanted to the specimen 7. A suppressor power supply 30 is applied with a suppressing voltage by a suppressor electrode 31. 32 is a Faraday cage and 33 is a rotating disk table which mounts the specimen 7. 12 and 13 are current meters and 35 is a part of the Faraday cage 32 and have the same function as the electrode 35 in FIG. 1.

The charge suppressing device shown in FIG. 3 is used in FIG. 4 as stated above, and in the same way in FIG. 4, it is easy to use the charge suppressing device shown in FIG. 2 instead of that in FIG. 3.

I claim:

1. A particle beam irradiating apparatus comprising:
   a particle beam irradiating means for irradiating a charged particle beam to a specimen;
   a charge suppressing means having a charged particle source for irradiating a negatively charged particle beam to the specimen and an electrode for extracting the negatively charged particle beam from the charge suppression means towards the specimen; and
   a voltage supply for applying a bias voltage difference between the charged particle source and the specimen, wherein the absolute value of said bias voltage difference is not more than 10 V.

2. A particle beam irradiating apparatus as defined in claim 1, wherein said charged particle beam is an electron beam.

3. A particle beam irradiating apparatus as defined in claim 1, wherein said charged particle beam is an ion beam.

4. A particle beam irradiating apparatus as defined in claim 1, further comprising an electric field generating means for generating an electric field across the negatively charged particle beam in order to bend the negatively charged particle beam so the negatively charged particle beam does not reach the specimen straight from the charged particle source.

5. A particle beam irradiating apparatus as defined in claim 1, further comprising a magnetic field generating means for generating a magnetic field across the negatively charged particle beam in order to bend the negatively charged particle beam so the negatively charged particle beam does not reach the specimen straight from the charged particle source.

6. A particle beam irradiating apparatus comprising:
   a particle beam irradiating means for irradiating an ion beam which is selected by a mass spectrometer to a specimen;
   a charge suppressing means having a charged particle source for irradiating a negatively charged particle beam and an electrode for extracting the negatively charged particle beam from the charge suppression means towards the specimen; and
   a voltage supply for applying a bias voltage difference between the charged particle source and the specimen, wherein the absolute value of the bias voltage difference is not more than 10 V.

7. A particle beam irradiating apparatus as defined in claim 6, further comprising an electric field generating means for generating an electric field across the negatively charged particle beam in order to bend the negatively charged particle beam so the negatively charged particle beam does not reach the specimen straight from the charged particle source.

8. A particle beam irradiating apparatus as defined in claim 6, further comprising a magnetic field generating means for generating a magnetic field across the negatively charged particle beam in order to bend the negatively charged particle beam so the negatively charged particle beam does not reach the specimen straight from the charged particle source.

* * * * *